United States Patent [19] [11] 4,087,182
Aiba et al. [45] May 2, 1978

[54] PROCESS AND APPARATUS FOR PRODUCING A PHOTOPOLYMER PLATE HAVING RELIEF IMAGES THEREON

[75] Inventors: Hiroaki Aiba, Tokyo; Toshiie Matsui, Mitaka; Shu Yoshida, Kiyose, all of Japan

[73] Assignee: Asahi Kasei Kogyo Kabushiki Kaisha, Osaka, Japan

[21] Appl. No.: 671,725

[22] Filed: Mar. 29, 1976

[30] Foreign Application Priority Data

Apr. 4, 1975 Japan ................... 50-40346

[51] Int. Cl.² .................. G03B 27/30; G03B 27/02
[52] U.S. Cl. .................. 355/100; 96/36; 355/85; 355/132
[58] Field of Search .................. 355/78, 79, 85, 89, 355/97, 99, 100, 132; 96/36

[56] References Cited

U.S. PATENT DOCUMENTS

| 3,120,790 | 2/1964 | Carlson et al. ................... 355/3 R |
| 3,848,998 | 11/1974 | Yonekura et al. ................ 355/100 |
| 3,958,142 | 5/1976 | Seitz ............................... 355/97 X |
| 3,971,691 | 7/1976 | Cairns ............................ 355/85 X |
| 3,981,583 | 9/1976 | Tsuchida et al. ................ 355/100 |

Primary Examiner—Fred L. Braun
Attorney, Agent, or Firm—Armstrong, Nikaido, Marmelstein & Kubovcik

[57] ABSTRACT

Process and apparatus for producing a photopolymer plate having relief images thereon. Successive portions of a continuous length of a protective film material are travelled in a horizontal elongated plane defined by a pair of parallel and spaced guide rollers. A layer of liquid photosensitive material is applied to a length of the horizontal web of the protective film material. A length of backing material is then laminated onto the upper surface of the layer to form an assembly. The assembly is moved by the protective film material into a relief exposure station for the exposure of the lower surface of the layer through an image-bearing transparency and the protective film material to an actinic radiation. The laminated portion of the backing material is separated from the remaining continuous web of the backing material. The image-bearing transparency is fed to the relief exposure station by a continuous length of another film material. After exposure, the protective film material is peeled off from the lower surface of the exposed layer, which is then delivered to a washing-out section wherein the unhardened non-exposed portions of the layer are washed out to form relief images on the backing material. Major components of the apparatus are plurality of rollers for driving and/or guiding the protective film material, backing material and transparency-conveying film material. The apparatus is thus simplified in construction.

37 Claims, 13 Drawing Figures

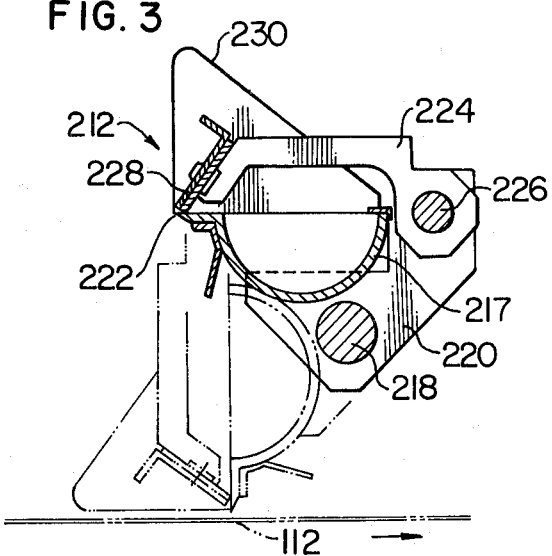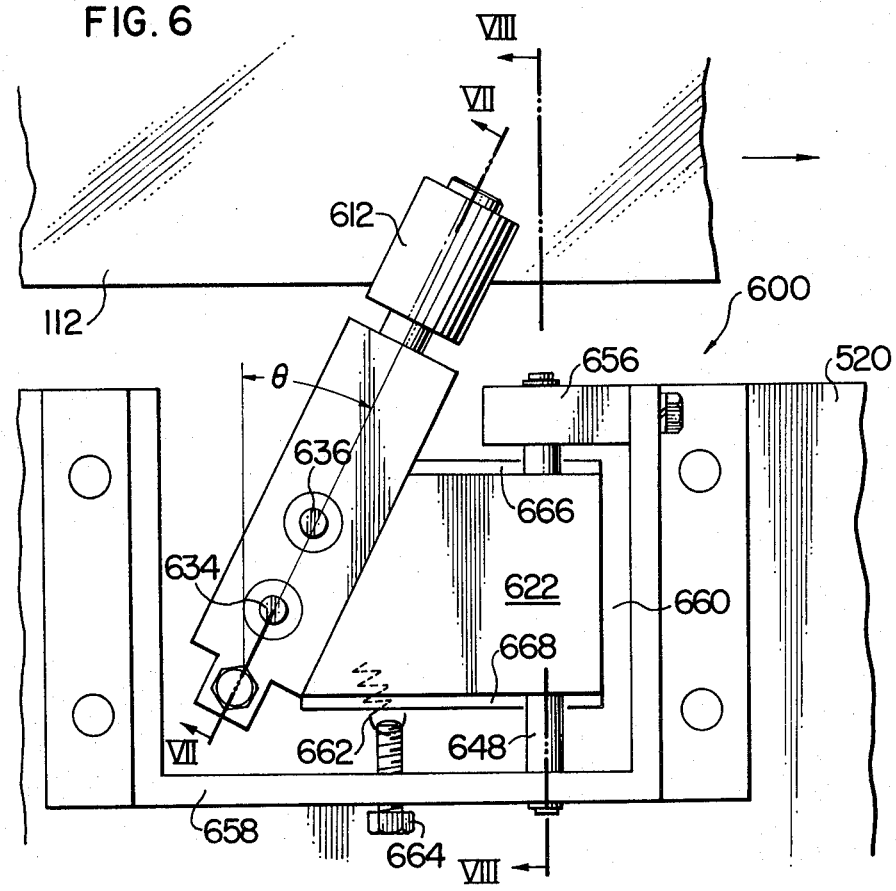

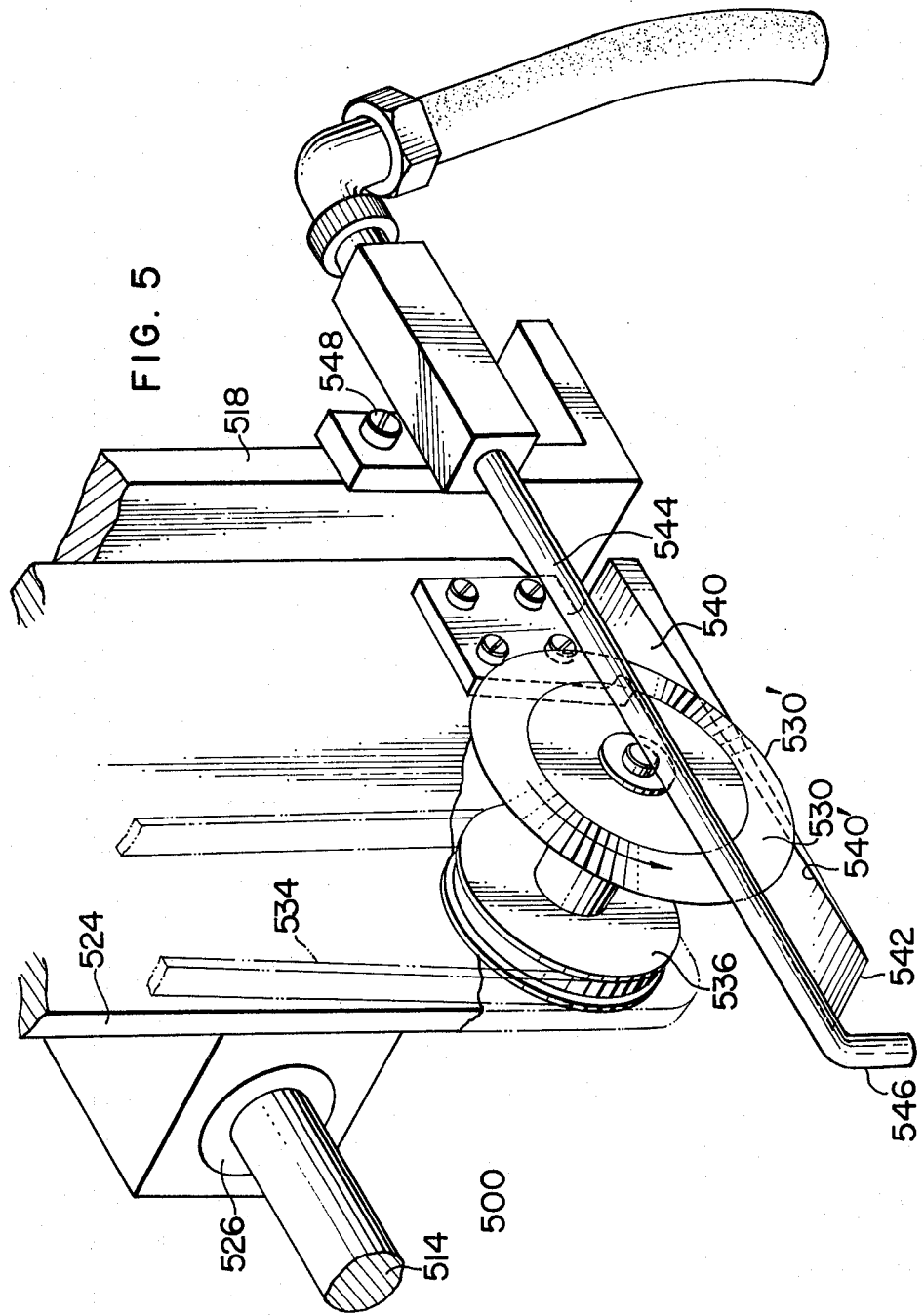

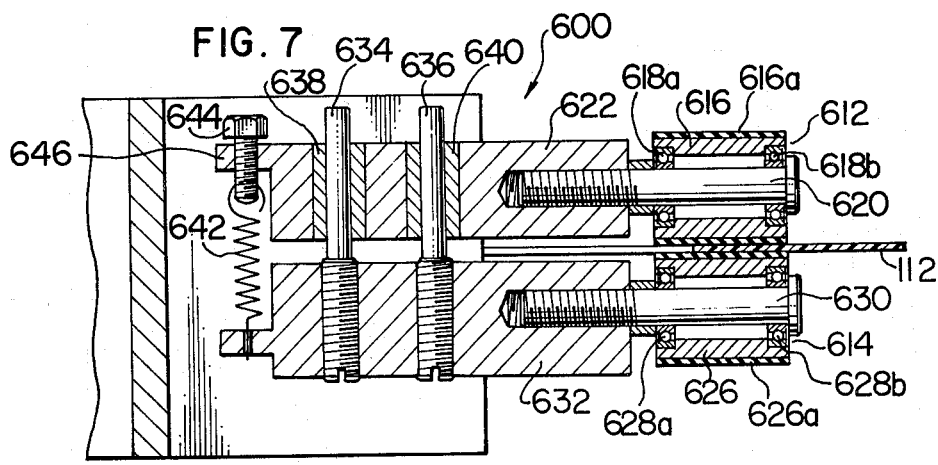
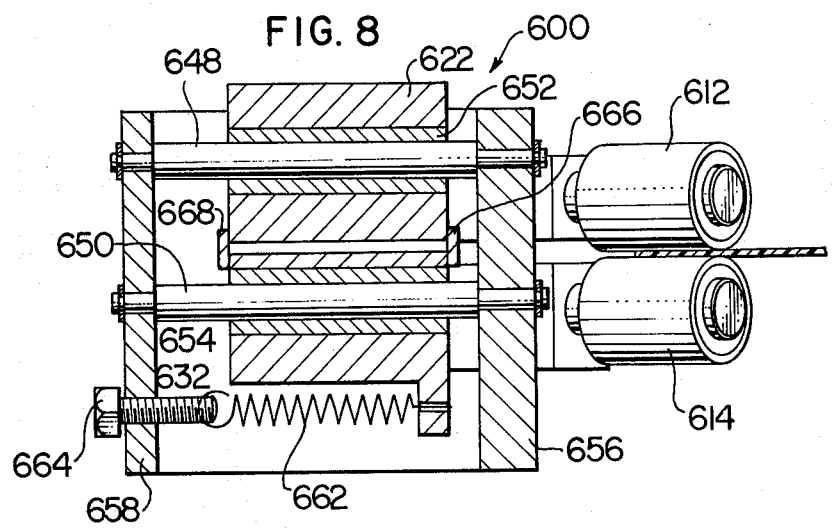

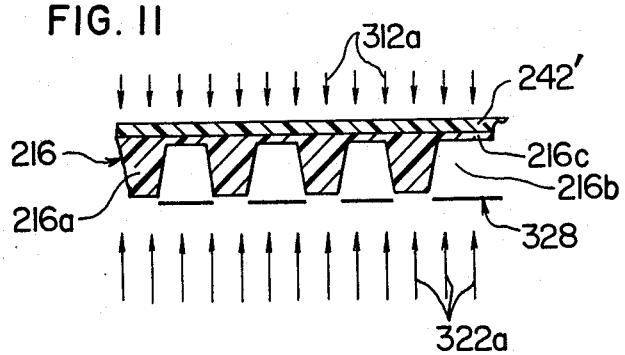
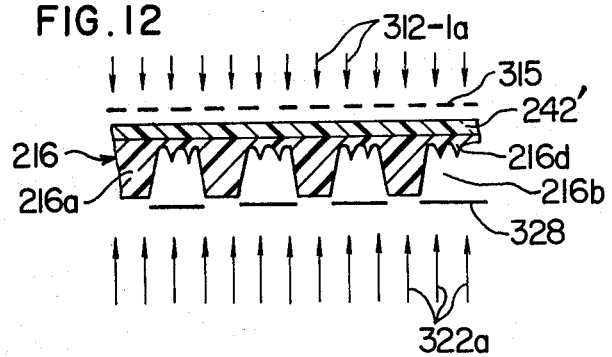
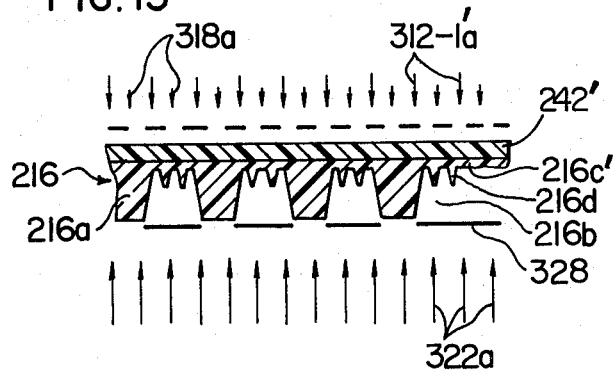

PROCESS AND APPARATUS FOR PRODUCING A PHOTOPOLYMER PLATE HAVING RELIEF IMAGES THEREON

The present invention relates to process and apparatus for producing photopolymer plates having relief images for use on printing machines such as, for example, a relief printing machine.

U.S. Pat. No. 3,848,998 issued Nov. 19, 1974 to Saku Yonekura et al of Japan discloses process and apparatus for producing a photopolymer plate having relief images thereon. In the apparatus disclosed in the U.S. patent, an image-bearing transparency is placed on a rigid plate capable of transmitting an actinic radiation, such as a sheet of glass. A sheet of protective film material is placed on the image-bearing transparency. The protective film material is also capable of transmitting the actinic radiation. A layer of liquid photosensitive material, which is also disclosed in the U.S. patent referred to above, is applied to the upper surface of the sheet of protective film material. A sheet of backing material is then laminated onto the upper surface of the photosensitive layer to form an assembly. The rigid plate is mounted on a support which is movable together with the image-bearing transparency and the assembly thereon to an exposure station where the lower surface of the photosensitive layer is exposed through the image-bearing transparency and through the rigid plate to an actinic radiation. The sheet of the protective film material is then removed from the lower surface of the exposed photosensitive layer. The layer and the sheet of backing material thereon are then moved into a washing-out section where the unhardened non-exposed portions of the photosensitive layer are removed to form relief image on the sheet of backing material.

The apparatus disclosed in the U.S. patent referred to above is improved over the prior art disclosed in U.S. Pat. Nos. 3,520,606, 3,687,785 and No. 3,635,711. The apparatus is operable satisfactorily but needs a complicated construction because the rigid plate must be moved along a rectilinear path extending from a photosensitive material applying station to the exposure station. In addition, sophisticated means are needed to feed a sheet of protective film material onto an image-bearing transparency placed on the rigid plate and also feed and laminate a sheet of backing material onto the upper surface of a layer of the photosensitive material formed on the sheet of the protective film material. Moreover, complicated means are required for removing the sheet of protective film material from the lower surface of the exposed photosensitive layer.

The present invention aims to provide improved process and apparatus for producing a photopolymer plate having relief images thereon.

According to a feature of the present invention, there is provided an improved process of producing a photopolymer plate having relief image areas thereon, the process comprising the steps of:

(a) feeding a sheet of protective film material to a liquid photosensitive material applying station, said film material being capable of transmitting an actinic radiation therethrough;

(b) applying a liquid photosensitive material to the upper surface of said sheet of protective film material to form a layer of the photosensitive material thereon;

(c) laminating a sheet of a backing material onto said layer of photosensitive material to form an assembly of said protective film material, said layer of photosensitive material and said backing material;

(d) conveying said assembly to a relief exposure station and exposing the lower surface of said assembly through an image-bearing transparency to the actinic radiation;

(e) removing said sheet of protective film material from the lower surface of the thus exposed layer of photosensitive material; and (f) removing unhardened non-exposed portions of said layer of photosensitive material to form relief images on said backing material;

the improvement comprising:

performing said liquid photosensitive material feeding step, said backing material laminating step, said exposing step and said protective film removing step in sequential manner and in a substantially horizontal elongated plane having an end positioned adjacent to said liquid photosensitive material applying station;

supplying successive portions of a continuous web of said protective film material into said horizontal plane so that a length of said protective film material extends in said horizontal plane substantially in wrinkle-free condition;

supporting, at said liquid photosensitive material applying station, a part of said length of protective film material by a substantially flat upper surface of a stationary support member while said part of said length of protective film material is being coated with a layer of said liquid photosensitive material;

generally downwardly turning the leading end of said length of protective film material at the other end of said horizontal plane and pulling said leading end in said turned direction so that successive portions of said continuous web of protective film material are travelled along said horizontal plane, whereby said layer of photosensitive material and said sheet of backing material thereon are conveyed by said continuous web of protective film material to said relief exposure station for the exposure of the lower surface of said layer through said image-bearing transparency and through said protective film material to said actinic radiation and said protective film material is removed at said other end of said horizontal plane from the lower surface of the thus exposed layer.

According to another feature of the present invention, there is provided an improved apparatus for producing a photopolymer plate having relief image areas thereon, said apparatus comprising:

(a) a liquid photosensitive material applying station;

(b) means for feeding to said station a sheet of protective film material capable of transmitting actinic radiation therethrough;

(c) means for applying a liquid photosensitive material to the upper surface of said sheet of protective film material to form a layer of photosensitive material thereon;

(d) means for laminating a sheet of a backing material onto said layer of photosensitive material to form an assembly of said protective film sheet, said photosensitive material layer and said backing material sheet;

(e) relief exposure means designed to receive said assembly and including a lower light source for directing the actinic radiation through an imagebearing transparency and said protective film sheet to the lower surface of said photosensitive material layer;

(f) means for removing said sheet of protective film material from the lower surface of the thus exposed layer of photosensitive material; and (g) means for removing unhardened non-exposed portions of said layer of photosensitive material to form relief images on said sheet of backing material;

(h) said liquid photosensitive material applying means, said laminating means, said exposure means and said protective film removing means being arranged in series;

the improvement comprising:

a pair of parallel and spaced guide rollers defining a substantially horizontal elongated plane generally along which said series of means are disposed, one of said pair of guide rollers being disposed adjacent to one end of said series of means adjacent to said liquid photosensitive material applying station, the other guide roller being disposed at the other end of said series of means;

means for supplying successive portions of a continuous web of said protective film material into said horizontal plane so that a length of said protective film material extends between said pair of guide rollers substantially in wrinkle-free condition, said sheet of protective film material to which said liquid photosensitive material is applied being a part of said length of protective film material;

a stationary member at said liquid photosensitive material applying station having a substantially flat upper surface disposed in face to face contacting and supporting relationship to said part of said length of protective film material while said part is being coated with said layer of photosensitive material; and means for generally downwardly pulling the leading end of said length of protective film material around the periphery of said other guide roller so that successive portions of said continuous web of protective film material are travelled from said one guide roller through said series of means to said the other guide roller, whereby said photosensitive material layer and said backing material sheet thereon are conveyed by said continuous web of protective film material into said exposure means for the exposure of said layer and said protective film material is removed at said the other guide roller from the lower surface of the thus exposed layer of photosensitive material.

The invention will be described by way of example with reference to the accompanying drawings.

FIG. 3 is an enlarged sectional view of a bucket shown in FIGS. 1 and 2;

FIG. 5 is an enlarged, fragmentary perspective view of a part of the cutter shown in FIGS. 1, 2 and 4;

FIG. 6 is an enlarged top plan view of one of pinch roller units shown in FIGS. 1 and 2;

FIG. 7 is a cross-sectional view of the pinch roller unit shown in FIG. 6 taken along line VII — VII in FIG. 6;

FIG. 8 is a partially sectional side view of the pinch roller unit shown in FIG. 6 taken along line VIII — VIII in FIG. 6;

FIGS. 11 to 13 are enlarged, fragmentary, diagrammatic sectional views of photopolymer plates produced by the apparatus of the invention.

Figure 1:
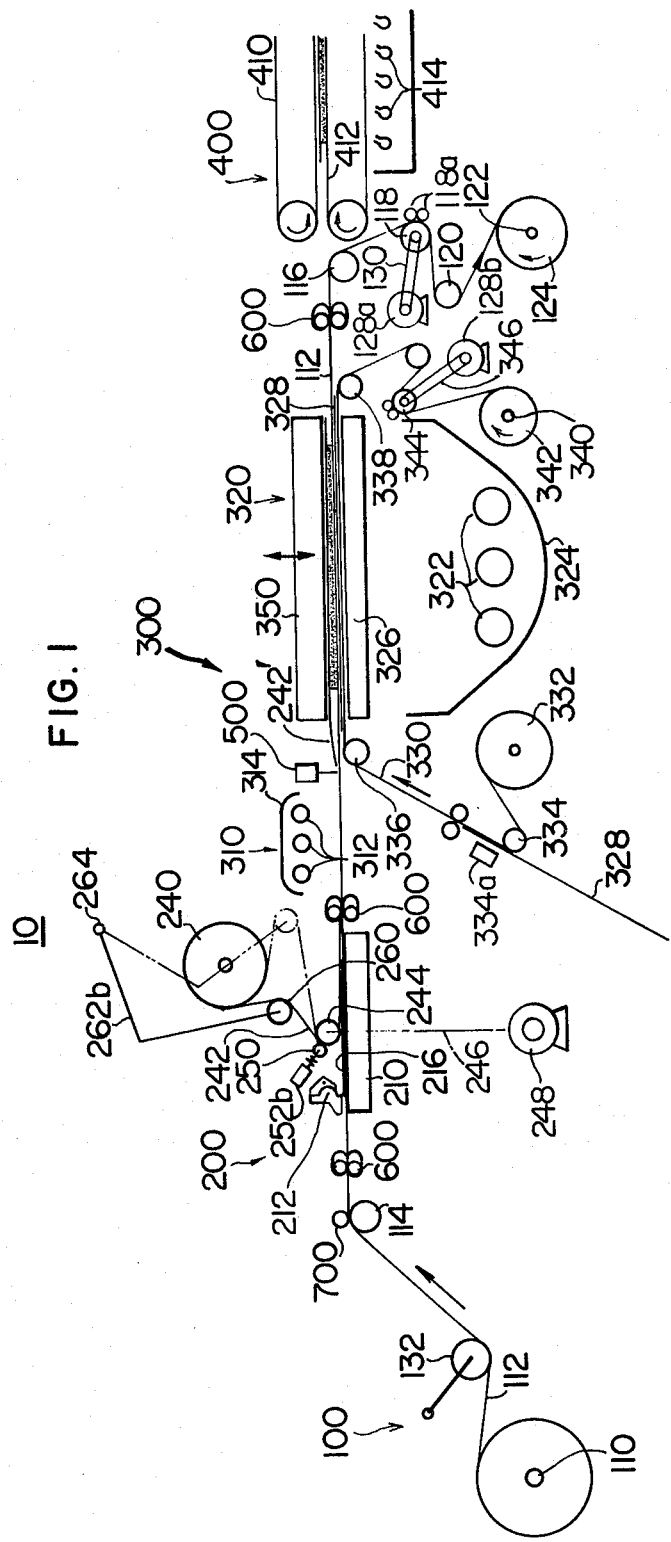
FIG. 1 is a diagrammatic side view of an embodiment of an apparatus for producing a photopolymer plate according to the present invention with a part of the apparatus being removed to symplify the illustration.
Figure 2:
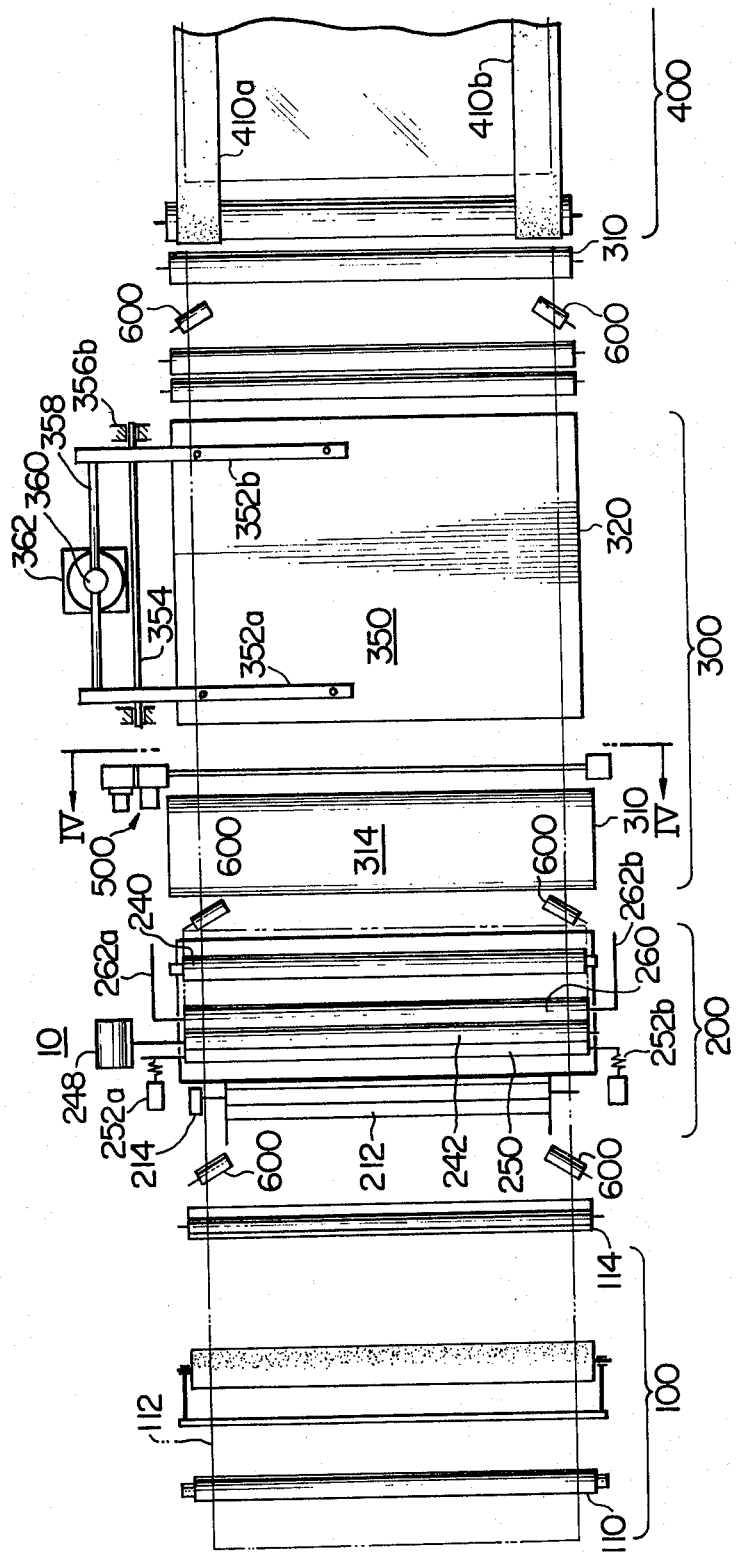
FIG. 2 is a diagrammatic top plan view of the apparatus shown in FIG. 1 with a part of the apparatus being removed to symplify the illustration.

Referring first to FIGS. 1 and 2, an embodiment of the apparatus for producing a photopolymer plate having relief images is generally indicated by reference numeral 10 and briefly sectionalized into a protective film feeding section 100, a liquid photosensitive material applying section 200, an exposure section 300 and a washing-out section 400.

In the protective film feeding section 100, a supply roll 110 of a continuous web of a protective film material 112 is rotatably mounted on a machine frame (not shown). The web of the protective film material 112 is drawn from the roll 100 and extends around a first guide roller 114 rotatably mounted on the machine frame between the protective film feeding section 100 and the liquid photosensitive material applying section 200. The film material 112 is capable of transmitting actinic radiation for the purpose to be made apparant later. The film material 112 may preferably be a film of polypropylene. A film of polyethylene will also be usable.

From the first guide roller 114, the web of the protective film material 112 extends to a second guide roller 116 which is disposed between the exposure section 300 and the washing-out section 400 in parallel relationship to the first guide roller 114. The film material 112 further extends around the second guide roller 116 and other rollers 118 and 120 and is wound up on a take-up spool 122 to form a roll 124. The roller 118 is drivingly connected to a motor 128a by a belt 130 and disposed in frictional driving contact with the web of the protective film material 112. Pressure rollers 118a urge the protective film material 112 against the driving roller 118 to facilitate the frictional contact between the film material 112 and the roller 118. A torque motor (not shown) is connected to the spool 122 to rotate the roll 124 clockwise so that the successive portions of the web of the protective film material 112 are wound up on the roll 124. The second guide roller 116 is positioned substantially at the same level as the first guide roller 114. Thus, the web of the protective film material 112 extends substantially horizontally between the first and second guide rollers 114 and 116. In the illustrated embodiment of the invention, a tension roller 132 is provided in the feeding section 100 to advantageously assure the horizontal position of the web of the protective film material 112 between the guide rollers 114 and 116. However, the tension roller 132 is not essential for the apparatus of the invention and may be replaced by a braking device (not shown) which is designed to apply a braking force to the supply roll 110.

In the liquid photosensitive material applying section 200, a stationary film support member 210 of a rigid material, such as a metal, having a substantially flat upper surface is disposed so that the upper surface is in face to face contacting and supporting relationship to the lower surface of a part of the horizontal web of the protective film material 112. The upper surface of the film support member 210 has a longitudinal dimension which is somewhat larger than the longitudinal or widthwise dimension of a desired photopolymer plate to be produced by the apparatus of the invention. The dimension of the film support member 210 measured in the widthwise direction of the web of the protective film material 112 may be substantially the same as or slightly smaller than the widthwise dimension of the web of the film material 112.

A bucket 212 extends widthwise of the horizontal web of the protective film material 112 and is positioned above the left or leading end portion of the film support member 210. The bucket 212 is designed to receive an amount of a liquid photosensitive material and apply the material to the upper surface of a predetermined length of the horizontal web of the protective film material 112. For this purpose, the bucket 212 is pivotable by a reversible motor 214 (FIG. 2) between a lowered positioned shown in FIG. 1 and an elevated position (not shown) about a substantially horizontal axis extending above the horizontal web of the protective film material 112 and transversely of the longitudinal axis thereof. As will be seen in FIG. 2, the opposite ends of the bucket 212 are positioned inwardly of the side edges of the horizontal web of the protective film material 212. It will be appreciated that if the bucket 212 is filled with an amount of the liquid photosensitive material and if the web of the protective film material 112 is being travelled rightwards by the driving roller 126, the pivotal movement of the bucket 212 from the elevated position towards the lowered position shown in FIG. 1 will allow the liquid photosensitive material to gradually flow over the front edge of the bucket onto the upper surface of the travelling web of the protective film material 112 for thereby forming a layer 216 of the photosensitive material along the predetermined length of the protective material 112.

Referring to FIG. 3, the bucket 212 comprises a trough 217 of a generally semicircular cross-section secured to a shaft 218 by means of a pair of brackets 220 (only one of which is shown) mounted on the shaft at the opposite ends thereof. The shaft 218 is drivingly connected to the output shaft of the reversible motor 214, as diagrammatically shown in FIG. 2. The trough 217 is provided with a pouring edge 222 along one of the edges of the trough. A pair of arms 224 (only one of which is shown) are pivotally mounted on the brackets 220 by means of a second shaft 226 which is offset from the shaft 218 and positioned adjacent to the other edge of the trough 217. The arms 224 extend toward the pouring edge 222 of the trough 216. A flow controlling blade 228 is secured to the free ends of the arms 224 and extends in substantially parallel relationship with the pouring edge 222. When the members of the bucket 212 are rotated about the axis of the shaft 218 from the solid line position to the broken line position shown in FIG. 3, the liquid photosensitive material flows from the trough 217 onto the travelling web of the protective film material 112 to form a layer 216 (FIG. 1). At the most lowered position of the bucket 212 shown by the broken line in FIG. 3, the pouring edge 222 is slightly spaced a small distance above the upper surface of the web of the protective film material 112 primarily to control the thickness of a layer 216 of the photosensitive material to be formed thereon. A pair of generally triangular plates 230 (only one of which is shown) are mounted on the opposite ends of the trough 217 to prevent the liquid photosensitive material from flowing laterally outwardly of the width of the protective film material 112. When the liquid photosensitive material is applied to a predetermined length of the protective film material, the arms 224 are rotated about the axis of the shaft 226 to move the blade 228 into sealing engagement with the pouring edge 222. Simultaneously, the bucket 212 is rotated about the axis of the shaft 218 to finish the application of the photosensitive material to the predetermined length of the web of the protective film material 112.

Referring again to FIGS. 1 and 2, a roll 240 of a continuous web of a backing material 242 capable of transmitting actinic radiation is rotatably mounted on the machine frame (not shown) above the stationary support member. The backing material 242 may be any one of the backing materials disclosed in U.S. Pat. No. 3,848,998 referred to above. The continuous web 242 is drawn from the roll 240 and extends around a backing material feeding roller 244 and through a gap defined between the roller 244 and the horizontal web of the protective film material 112. The roller 244 is designed to be driven by a reversible motor 248. The torque of the motor 248 can be transmitted to the roller 244 through a transmission which is diagrammatically shown in FIG. 1 by a broken line 246. A pressure roller 250 is biased towards the axis of the roller 244 by a pair of compression springs 252a and 252b so that the backing material 242 is urged by the pressure roller 250 into frictional engagement with the roller 244. For the purpose to be made apparent later, a return roller 260 is supported by arms 262a and 262b which are pivotally connected at their upper ends to the machine frame (not shown) at points 264 (only one of which is shown) above the roll 240 of the backing material 242 so that the roller 260 is urged by gravity into rolling contact with the web of the backing material 242 between the roll 240 and the feeding roller 244. When the roller 244 is driven by the motor 248, the backing material 242 is drawn from the supply roll 240 onto the horizontal web of the protective film material 112. Thus, it will be appreciated that, when a length of the web of protective film material 112 with a layer 216 thereon is moved into the gap between the upper surface of the stationary support member 210 and the backing material feeding roller 244, the backing material 242 is laminated onto the layer 216 to form an assembly. The roller 244 is precisely positioned such that the spacing between the bottom side of the roller 244 and the upper surface of the stationary support member 210 is equal to the total of the thickness of the protective film material 112, the desired final thickness of the layer 216 and the thickness of the backing material 242. Thus, the roller 244 is operable to finally control the thickness of the layer 216 on the protective film material 112.

The assembly of the protective film material 112, layer 216 of photosensitive material and backing material 242 is then moved into the exposure section 300 in which are provided a pre-exposure device 310 and a relief exposure device 320. The pre-exposure device 310 is disposed above the horizontal web of the protective film material 112 and comprises an actinic light source 312 and a reflector 314 disposed above the light souce 312 to reflect the actinic radiation downwardly toward the horizontal web of the protective film material 112 for the purpose to be made apparent later. The relief exposure device 320 is disposed downstream of the pre-exposure device 310 and includes a second actinic light source 322 disposed below the horizontal web of the protective film material 112. A second reflector 324 is disposed below the second actinic light source 322 to reflect the actinic radiation upwardly toward the horizontal web of the protective film material 122. The first and second actinic light sources 312 and 322 may be actinic radiation lamps disclosed in U.S. Pat. No. 3,848,998.

A substantially flat rigid plate 326 capable of transmitting the actinic radiation, such as a sheet of glass, is disposed above the second actinic light source 322 and just below the horizontal web of the protective film material 112 so that the flat upper surface of the rigid plate 326 is closely spaced from the web of the protective film material 112. The rigid plate 326 is designed to receive thereon a sheet of an image-bearing transparency 328 fed into the space defined between the rigid plate 326 and the horizontal web of the protective film material 112. The image-bearing transparency 328 may be fed by manual operation. In the illustrated embodiment of the invention, however, the image-bearing transparency 328 is fed onto the rigid plate 326 by a continuous web of film material 330 which is capable of transmitting the actinic radiation and which may be the same as the film material 112. The continuous web 330 is drawn from a supply source in the form of a roll 332 and extends around a first guide roller 334 disposed adjacent to the roll 332. The web 330 then extends around second and third guide rollers 336 and 338 which are disposed adjacent to the leading and trailing edges of the rigid plate 326, respectively, so that the web 330 between the second and third guide rollers 336 and 338 extends through the space between rigid plate 326 and the horizontal web of the protective film material 112 in closely spaced relationship therewith. A driving roller 344 is in frictional driving engagement with the web of the transparency-conveying film material 330 and drivingly connected by a belt 346 to a motor 128b. It will be appreciated that, when the motor 128b is energized, the web 330 is travelling on the rigid plate 326 substantially at the same speed as the travel of the horizontal web of the protective film material 112. Successive image-bearing transparencies 328 may be fed onto the web 330 at a position adjacent to the first guide roller 334 and attached to the web 330 by electrostatic force generated by an electrostatic charging device 334a. A torque motor (not shown) is connected to a take-up spool 340 to wind up successive portions of the transparency-conveying film material 330 thereon for thereby forming a roll 342 of the film material 330.

It will be appreciated that, when an imagebearing transparency 328 is conveyed by the web 330 to a predetermined position above the rigid plate 326 and a length of the protective film material 112 carrying thereon a layer 216 of the photosensitive material and the backing material 242 thereon is moved to the position just above the image-bearing transparency 328, the energization of the second actinic light source 322 will be effective to direct the actinic radiation from the light source upwardly so that portions of the layer 216 are exposed to the actinic radiation correspondingly to the images carried by the transparency 328 and thus are hardened. In such an instance, chemical reaction takes place at the exposed portions of the layer 216 to produce heat of reaction which would be accumulated in the lower rigid plate 326. If much heat is accumulated in the plate 326, it will suffer from flexion and deformation which would tend to produce flexion and deformation in the layer 216 of the photosensitive material. In order to prevent the production of such flexion and deformation, the assembly consisting of the backing material 242, the layer 216, the protective film 112, the image-bearing transparency 328 and the transparency-conveying film 330 is contacted during exposure by a second rigid plate 350 provided above the horizontal web of the protective film material 112 substantially in vertical alignment with the lower rigid plate 326 to receive the heat of reaction from the layer 216 and radiate the received heat.

As best shown in FIG. 2, the second or upper rigid plate 350 is secured to one ends of a pair of levers 352a and 352b which are mounted on a shaft 354 which in turn is rotatably mounted at its opposite ends on stationary parts 356a and 356b of the machine frame (not shown). The other ends of the levers 352a and 352b are rigidly connected by a rod member 358 which is operatively connected to a piston rod 360 of a fluid pressure-operated piston-cylinder assembly 362 which extends substantially vertically but is pivotally mounted on the machine frame so as to be swung in a vertical plane including the axis of the piston rod 360 and perpendicular to the axis of the shaft 354. The piston rod 360 is normally held in its retracted position to keep the upper rigid plate 350 in its elevated or open position. When a length of the protective film material 112 carrying a layer 216 of the photosensitive material and the backing material 242 is moved to the position above the lower rigid plate 326, the piston rod 360 is moved upwardly to lower the upper rigid plate 350 to the position shown in FIG. 1 for the purpose discussed above.

A cutter 500, to be described in detail later, is provided between the pre-exposure device 310 and the relief exposure device 320 to sever the web of the backing material 242 adjacent to the upstream edge of the relief exposure device 320 so that the portion of the web of backing material downstream of the cutter 500 is separated from the continuous web of the backing material 242 to form a separated sheet of backing material 242'.

The purpose for the pre-exposure device is to expose an upper part of the thickness of the layer 216 of the photosensitive material to the actinic radiation from the light source 312 to preliminarily activate the photosensitive material so that the time required for the relief exposure by means of the lower actinic light source 322 is shortened. The pre-exposure may be performed while the web of the protective film material 112 is being moved under the pre-exposure device 310. However, the pre-exposure device is not essential to the present invention.

When the exposure of the layer 216 of the photosensitive material to the actinic radiation provided by the actinic light source 322 is completed, the web of the protective film material 112 will be moved rightwards by the driving roller 118. When the length of the protective film material 112 carrying the layer 216 and the separated sheet of backing material 242' reaches the second guide roller 116, only the protective film material 112 is pulled by the driving roller 118 downwardly around the guide roller 116 and thus is peeled off from the lower surface of the exposed layer 216 of the photosensitive material. The remaining assembly of the exposed layer 216 and the sheet of the backing material 242' is delivered into a washing-out section 400 and received by a nip defined between upper and lower conveyors 410 and 412. The upper conveyor 410 comprises a pair of parallel conveyor belts 410a and 410b, while the lower conveyor 412 comprises a pair of parallel conveyor belts, although only one of which is shown in FIG. 1. The upper and lower pairs of the conveyor belts are so spaced from each other that the side edge portions of the assembly of the exposed layer 216 and the sheet of the backing material 242' are pinched by the upper and lower conveyor belts for the travel of the assembly through the washing-out section 400. Nozzles 414 are provided in this section to direct jets of a fluid to the lower surface of the exposed layer 216 of the photosensitive material so that unhardened non-exposed portions of the layer 216 are removed to form relief images on the backing sheet 242'. Details of such a washing-out section are disclosed in U.S. Pat. No. 3,848,998. The relief images thus obtained may be subjected to further treatment as discussed in the U.S. patent mentioned above.

Figure 4:
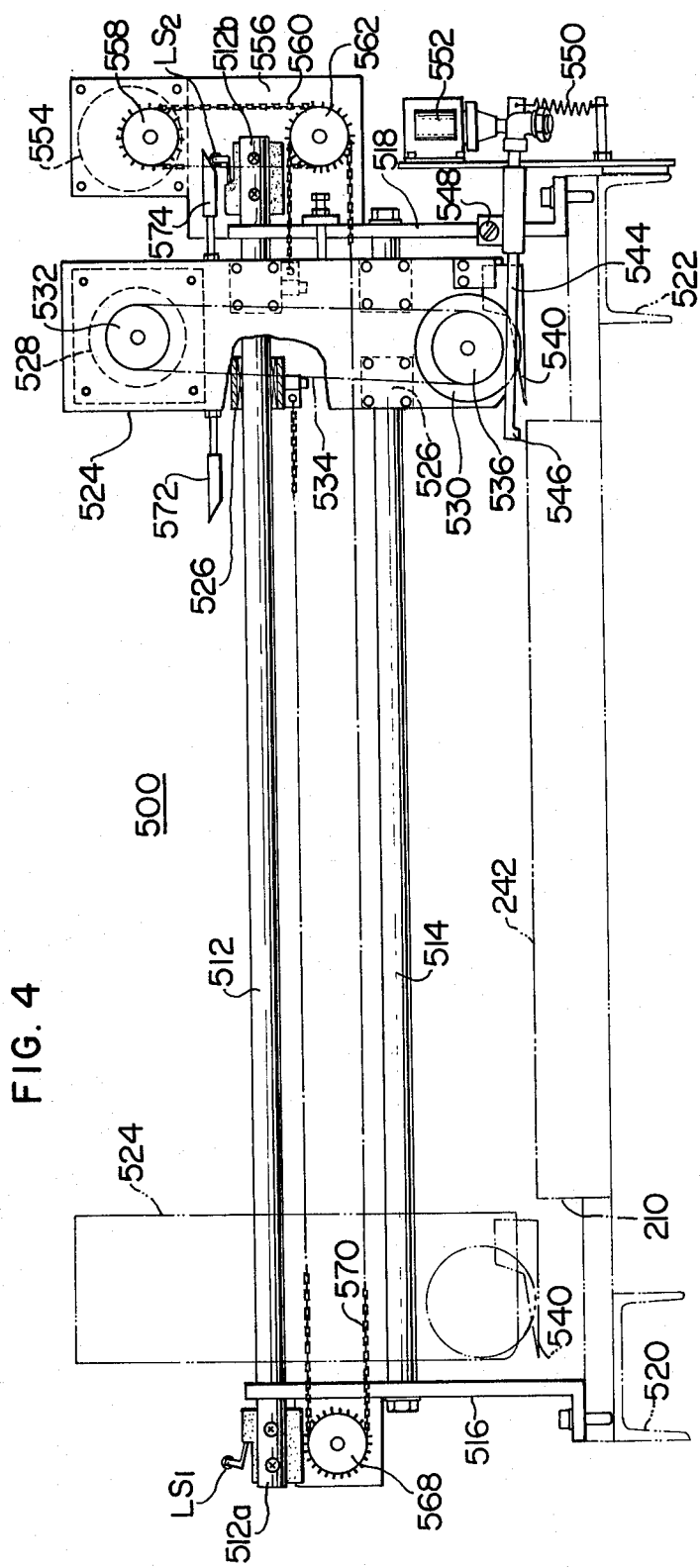
FIG. 4 is an enlarged side elevation of a cutter shown in FIGS. 1 and 2 as viewed from line IV — IV in FIG. 2.

Referring now to FIGS. 4 and 5, the cutter 500 includes a pair of vertically spaced and parallel rails 512 and 514 extending widthwise of the horizontal web of the protective film material 112 and secured at their opposite ends to brackets 516 and 518 rigidly mounted on and upstanding from longitudinal frame members 520 and 522 of the apparatus. A carriage 524 is slidably mounted on the upper and lower rails 512 and 514 by means of bearings 526. The carriage 524 extends transversely of the axes of the rails 512 and 514 and carries a first motor 528 and a cutting disc 530 mounted on the carriage adjacent to the upper and lower ends thereof. The disc 530 has a cutting edge 530' formed along the peripheral edge thereof. A pulley 532 is rigidly mounted on the output shaft of the motor 528 and drivingly connected by an endless belt 534 to a second pulley 536 which is mounted on the axle of the cutting disc 530 for rotation therewith. The cutting disc 530 is positioned such that the bottom of the cutting edge 530' is located slightly above the level of the web of the backing material 242 laminated onto the layer 216 of the photosensitive material.

A separator 540 is mounted on the carriage 524 adjacent to the bottom of the cutting disc 530. The separator 540 has a substantially horizontal bottom face which is positioned substantially at the same level as the web of the backing material 242. The upper face of the separator 540 is inclined downwardly and inwardly to a sharped inner edge 542 which is located nearer to the adjacent side edge of the web of the backing material 242 than the bottom of the cutting disc 530. The outer end of the upper surface of the separator 540 is located above the bottom of the cutting disc 530. The separator 540 and the cutting disc 530 are arranged such that the cutting edge 530' of the disc 530 cooperates with the adjacent side edge 540' of the separator 540 to sever the web of the backing material 242 when the carriage 524 is moved by a second motor 554 leftwards as viewed in FIG. 4.

In order to facilitate the insertion of the separator 540 between the backing material 242 and the protective film material 112, a means is provided to slightly lift the backing material 242 away from the protective film material 112. This lift means comprises a pipe 544 having an inner end 546 bent downwardly and located inwardly of the inner edge 542 of the separator 540. The pipe 544 is connected at its outer ends to a vacuum source (not shown) and pivotally mounted at its intermediate portion on the bracket 518 by a screw. The outer end of the pipe 544 is resiliently biased downwardly by a tension spring 550. The outer end of the pipe 544 is also connected to a solenoid 552 which, when energized, is operative to pivotally move pipe 544 in counterclockwise direction to a position in which the bottom end of the downwardly bent inner end 546 of the pipe 544 is located slightly above the level of the backing material 242. In this position of the pipe 544, the edge portion of the backing material 242 adjacent to the inner end 542 of the separator 540 is sucked by the vacuum against the bottom of the inner end 546 of the pipe 544. Thus, when the solenoid 552 is deenergized, the inner end 546 of the pipe 544 is lifted by the tension spring 550 together with the edge portion of the backing material 242.

The carriage 524 is reciprocally movable by the second motor 554 between a first position, which is shown by solid lines in FIG. 4 and in which the inner edge of the separator 540 is located slightly outwardly of one of the edges of the backing material 242 and the inner end 546 of the pipe 544 is located above the edge portion of the backing material 242, and a second position which is shown by broken lines in FIG. 4 and in which the cutting disc 530 and the separator 540 have been moved across the width of the backing material 242 and are located outside the other edge thereof. The second motor 554 is mounted on the bracket 518 by means of a mounting 556. The motor is connected to a first sprocket 558 which is drivingly connected by a first chain 560 to one of double sprockets 562 (only one of which is shown) rotatable as a unit on the mounting 556. A fourth sprocket 568 is rotatably mounted on the other bracket 516. A second chain 570 having opposite ends connected to the carriage 524 extends around the other of the double sprockets 562 and the fourth sprocket 568, so that the rotation of the second motor 554 is effective to move the carriage 524 in either direction. The second motor 554 is a reversible motor. Limit switches $LS_1$ and $LS_2$ are mounted on extensions 512a and 512b, respectively, which extend beyond the brackets 516 and 518, respectively. The carriage 524 carries limit switch actuators 572 and 574 which are brought into engagement with the operating arms of the limit switches $LS_1$ and $LS_2$ when the carriage 524 is moved substantially to the ends of the travel of the carriage. The limit switch $LS_1$, when actuated by the actuator 572, is operative to reverse the rotation of the second motor so that the carriage 524 is moved towards the limit switch $LS_2$. When the limit switch $LS_2$ is actuated by the actuator 574, the motor 554 is deenergized and the carriage 524 is held at its rest position shown in FIG. 4 by the solid lines until the motor is again energized by the operation of a further switch (not shown).

Referring again to FIGS. 1 and 2, the illustrated embodiment of the apparatus is further provided with means for applying tension to the horizontal web of the protective film material 112 in the widthwise direction thereof to assure that the horizontal web of the film material 112 is free from wrinkle. The tension applying means comprise a plurality of pairs of pinch roller units 600 disposed along the opposite side edges of the horizontal web of the protective film material 112 so that pinch roller units of each pair are substantially aligned widthwise of the protective film material, as best seen in FIG. 2. Only three pairs of the pinch roller units 600 are shown in FIGS. 1 and 2 for the simplification of the illustration, but it is to be noted that a more increased number of pairs of the pinch roller units may be used. Preferably, the pinch roller units 600 are disposed along each side of the protective film material at the intervals of about 30 to 50 centimeters.

Referring to FIGS. 6, 7 and 8, the pinch roller units 600 are substantially similar in construction and arrangement. Thus, it will be sufficient to describe the details of one of a series of pinch roller units 600 which are disposed along one of the edges of the protective film material 112 and mounted on the frame member 520. It is to be noted that another series of the pinch roller units 600 are disposed along the other edge of the protective film material and mounted on the frame member 552 (FIG. 4), although this feature is not shown in the drawings.

As shown in FIGS. 6 to 8, each pinch roller unit 600 comprises a pair of upper and lower pinch rollers 612 and 614 arranged to pinch the adjacent edge portion of the horizontal web of the protective film material 112. The axes of the rollers 612 and 614 are disposed in a vertical plane which forms an angle $\theta$ with a vertical plane perpendicular to the longitudinal axis of the horizontal web of the protective material 112. The angle $\theta$ preferably ranges from 5° L to 30°. The upper pinch roller 612 comprises a cylindrical roller member 616 rotatably mounted through a pair of bearings 618a and 618b on an axle formed by a stud 620 which extends substantially horizontally and is rigidly secured to an upper roller support 622. The outer peripheral surface of the roller member 616 is coated with a layer of a friction material 616a, such as rubber, having a large coefficient of friction with respect to the protective film material 112. The lower pinch roller 614 comprises a roller member 626 rotatably mounted through bearing 628a and 628b on an axle formed by a stud 630 extending parallel to the stud 620 and rigidly secured to a lower roller support 632 which is substantially vertically aligned with the upper roller support 622. The upper roller support 622 is movable relative to the lower roller support 632 along substantially vertical guide rods 634 and 636 slidably extending through bearing 638 and 640 fitted into holes in the upper roller support 622. The guide rods 634 and 636 have lower ends secured to the lower roller support 632 by means of screw threads. A tension spring 642 is provided between the upper and lower roller supports 622 and 632 to resiliently bias the upper pinch roller 612 towards the lower pinch roller 614 so that the protective film material 112 is pinched therebetween. The tension in the tension spring 642 is adjustable by rotating an adjust screw 644.

The upper and lower roller supports 622 and 632 are slidable on second set of substantailly horizontal guide rods 648 and 650 having axes disposed in a substantially vertical plane perpendicular to the longitudinal axis of the web of the protective film material 112. The guide rods 648 and 650 slidably extend through bearings 652 and 654, respectively, which are fitted into substantially horizontal bores formed in the upper and lower roller supports 622 and 632 at positions offset from the vertical guide rods 634 and 636. The opposite ends of each of the horizontal guide rods 648 and 650 are secured to legs 656 and 658 of a mounting 660 which is secured to the frame member 520. The legs 656 and 658 are spaced in the widthwise direction of the web of the protective film material 112. A second tension spring 662 extends between the lower roller support 632 and the outer leg 658 of the mounting 660. The tension in the tension spring 662 is adjustable by an adjust screw 664. Along the sides of the lower roller support 632 extending parallel to the longitudinal axes of the web of the protective film material 112, a pair of flanges 666 and 668 extend upwardly from the top of the lower roller support 632 and have inner surfaces which are in face to face contacting relationship with the corresponding sides of the upper roller support 622, respectively. Thus, it will be appreciated that the upper and lower roller supports 622 and 632 are movable as a unit in the widthwise direction of the web of the protective film material 112. The unit is resiliently biased away from the protective film material 112 by the tension spring 662.

Now, the operation of the apparatus described above will be described hereunder. Initially, a length of the protective film material 112 is drawn from the supply roll 110 and mounted on the apparatus as best shown in FIG. 1. The leading end of the protective film material 112 is attached to the take-up spool 122 and wound thereon by manual operation to form a roll 124 of a small diameter. Similarly, a length of the transparency conveying film material 330 is drawn from the supply roll 332 and mounted on the apparatus as shown in FIG. 1. The leading end of the transparency conveying film material 330 is also manually wound on the take-up spool 340 to form a roll 342 of a small diameter. A length of the backing material 242 is drawn from the supply roll 240 and threaded around the return roller 260 and the driving roller 244. The leading edge of the backing material 242 is located at a position substantially under the driving roller 244. An image-bearing transparency 328 is attached to the transparency-conveying film 330 at the guide roller 334. The bucket 212 is in its lifted or horizontal position and filled with an amount of the liquid photosensitive material. The rigid upper plate 350 is lifted by the piston-cylinder assembly 362 to complete the preparation of the operation. The liquid photosensitive material is disclosed in U.S. Pat. No. 3,848,998.

The motors 128a and 128b are energized to travel successive portions of the protective film material 112 and the transparency-conveying film material 330. Simultaneously, the bucket 212 is rotated by the motor 214 in counterclockwise direction so that the liquid photosensitive material is cast onto a required length of the protective film material to form a layer 216. The thickness of the layer 216 is primarily controlled by the puring edge 222 of the bucket 212, as discussed previously. Around the time when the leading edge of the layer 216 arrives at the driving roller 244, the same is driven by the motor 248 to feed the web of the backing material 242 onto the upper surface of the layer 216. When the layer 216 of the photosensitive material has been formed on the required length of the protective film material 112, the flow control blade 228 of the bucket 212 is moved into sealing engagement with the pouring edge 222 to discontinue the flow of the photosensitive material from the trough 217. The bucket is then rotated clockwise to its horizontal position.

The length of the protective film material 112 carrying the layer 216 and the backing material 242 thereon is continuously moved under the pre-exposure device 310 so that the upper surface of the photosensitive layer 216 is exposed through the backing material 242 to the actinic radiation from the upper light source 312. When the assembly consisting of the photosensitive layer 216, the backing material 242 and the required length of the protective film material 112 reaches a predetermined position in the relief exposure device 320, the motors 128a and 248 are deenergized to stop the travel of the protective film material 112 and the rotation of the backing material driving roller 244. Similarly, when the image-bearing transparency 328 reaches a predetermined position in the relief exposure device 320 which position is in substantially vertical alignment with the photosensitive layer 216, the motor 128b is deenergized to stop the travel of the transparency-conveying film material 330. The rigid upper plate 350 is then lowered to cooperate with the lower rigid plate 326 to pinch the backing material 242, the photosensitive layer 216, the protective film material 112, the image-bearing transparency 328 and the transparency-conveying film material 330 together. The lower light source 322 is then energized to expose the lower surface of the photosensitive layer 216 through the image-bearing transparency 328 and the transparency-conveying film material 330 to the actinic radiation from the light source 322. The vacuum source connected to the pipe 544 is also energized to suck the edge portion of the web of the backing material 242 against the bottom end of the downwardly bent end 546 of the pipe 544. The solenoid 552 is then deenergized to allow the pipe 544 to be rotated by the tension spring 550 in clockwise direction so that the edge portion of the backing material 242 is lifted away from the underlying protective film material 112 to form a gap therebetween. Simultaneously the first and second motors 528 and 554 of the cutter 500 are energized so that the carriage 524 is moved leftwards as viewed in FIG. 4 across the web of the backing material 242 and the cutting disc 530 is rotated. The leftward movement of the carriage 524 inserts the sharpened inner end portion of the separator 540 into the gap between the backing material 242 and the protective film material 112. The cutting edge 530' of the cutting disc 530 follows the inner end portion of the separator 540 and is brought into cutting engagement with the lifted edge portion of the backing material. The vacuum source is then deenergized and the solenoid 552 is energized to lower the inner end 546 of the pipe 540. The continued movement of the separator 540 is effective to lift widthwise successive portions of the web of the backing material 242. The cutting disc 530 is moved into cutting engagement with the successive portions of the backing material. When the carriage 524 has been moved across the web of the backing material 242 to the position shown by the broken lines in FIG. 4, the limit switch LS$_1$ is actuated to reverse the rotation of the second motor 554 so that the carriage 524 is moved towards its rest position shown by the solid lines in FIG. 4. The first motor 528 is also deenergized to discontinue the rotation of the cutting disc 530. When the carriage 524 is returned to the rest position, the limit switch LS$_2$ is actuated to discontinue the rotation of the second motor 554.

When the web of the backing material 242 has been served by the cutter 500, a sheet 242' laminated onto the layer 216 is separated from the continuous web of the backing material 242. Then, the roller 244 is rotated clockwise by the reversible motor 248, with a result that the return roller 260 is downwardly moved by gravity to the position shown by a broken line in FIG. 1 to return the leading end of the web of the backing material to its initial position under the driving roller 244. A braking force is applied to the roll 240 to hold the roll 240 against rotation when the return roller 260 is moved downwardly. Then, the motor 248 is deenergized.

When the exposure of the layer 216 of the photosensitive material to the lower actinic light source 322 has been completed, the rigid upper plate 350 is lifted by the piston-cylinder assembly 362. The motors 128a and 128b and then energized to rotate the driving rollers 118 and 344 to again move the web of the protective film material 112 and the web of the transparency-conveying film material 330 rightwards so that the exposed layer 216 of the photosensitive material and the sheet of the backing material 242' carried by the protective film material 112 and the image-bearing transparency 328 carried by the transparency-conveying film material 330 are removed from the relief exposure device 320. When the leading edge of the exposed layer 216 reaches the guide roller 116, the web of the protective film material 112 is turned downwardly by the roller 116 and thus is peeled or removed from the lower surface of the exposed layer 216. The remaining assembly consisting of the layer 216 and the sheet of the backing material 242' is delivered to the washing-out section 400 in which the belt conveyors 410 and 412 are driven to receive the assembly. The web of the transparency-conveying film material 330 is also turned downwardly by the guide roller 338. The image-bearing transparency 328 will be removed from the transparency-conveying film material 330 at a place adjacent to the guide roller 338. The assembly consisting of the exposed layer 216 of the photosensitive material and the sheet of the backing material 242' is processed in the washing-out section 400 in the manner discussed above and fully described in U.S. Pat. No. 3,848,988 referred to above.

The operation of the apparatus can be automatically controlled. The automatic control means may include a sensor in the form of a roller 700 which is in frictional rolling engagement with the portion of the web of the protective film material 112 which is moving around the guide roller 114. The roller 700 may be connected to a transducer operative to emit pulses in proportion to the revolutions of the roller 700. The pulses may be received by a controlling circuit and counted by a pulse counter therein. When the pulse counter has counted a predetermined number of pulses which represents that a specific portion of the web of the protective film material 112 has been moved a distance and reached a predetermined station, for example, the relief exposure device 320, the controlling circuit will emit sequential instruction signals to the motors 128a and 128b, the piston-cylinder assembly 362 and the power source of the actinic light source 322 so that the motor is stopped, the upper rigid plate 350 is lowered and the light source 322 is energized. Other movable elements and pre-exposure device may also be automatically controlled in similar manner. However, the automatic control of the apparatus is not a part of the present invention and thus will not be described herein.

FIG. 11 diagrammatically illustrates in an enlarged scale a cross-section of a photopolymer plate thus produced by the apparatus of the invention. The photopolymer plate carries thereon images provided by a plurality of projections 216a and recesses or grooves 216b which have been formed by the removal of those portions of the photosensitive material layer 216 which have not been exposed to the actinic radiation 322a from the actinic light source 322 and thus have not been hardened. The portion of the layer 216 adjacent to the sheet of backing material 242' which has been exposed to the actinic radiation 312a from the pre-exposure actinic light source 312 tends to be hardened as indicated by 216c.

Figure 9:
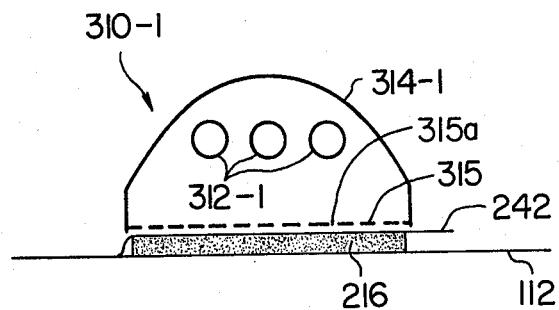
FIG. 9 is a diagrammatic side view of a modification of a pre-exposure device shown in FIGS. 1 and 2.

FIG. 9 illustrates a modification of the pre-exposure device 310. The modification is generally designated by 310-1 and comprises an actinic light source 312-1, a reflector 314-1 and a dotted image-bearing sheet shown by a dotted line 315. The dotted image-bearing sheet 315 extends across the lower peripheral edge of the reflector 314-1 and carries a large number of small dots 315a substantially uniformly distributed in the area of the sheet 315. Preferably, the dots 315a are sized such that 30 to 150 lines of dots 315a per inch are provided in the sheet 315. The dots 315a on the dotted image-carrying sheet 315 are capable of transmitting more actinic radiation than the remainder of the sheet 315. Thus, upper surface of the photosensitive layer 216 is exposed to only those portions of the actinic radiation which have passed through the dots 315a. The exposed portions of the photosensitive layer 216 are hardened. When the unexposed unhardened portions of the photosensitive layer 216 are removed as at 216b in the washing-out section 400, those portions of the layer 216 exposed to the actinic radiation 312-1a from the modified pre-exposure device 310-1 form small projections 216d between large projections 216a which have been formed by those portions of the layer 216 which have been exposed to the lower actinic radiation 322a through the image-bearing transparency 328. The formation of the small projections 216d between large projections 216a is advantageous in that, when the photopolymer plate produced by the present invention is used in relief printing, the small projections 216d are effective to prevent a sheet to be printed from being pressed into the bottoms of the recesses 216b defined between the large projections 216a. Thus, even if ink is deposited on the bottoms of the recesses 216b, the sheet to be printed will not be spoiled by the ink. It will be appreciated that, because the small projections 216d are quite small and have shaped points, the occurance of contact between the points of the small projections and the sheet to be printed does not produce any visible spots of ink on the surface of the sheet to be printed even if the points of the small projections are contaminated by the ink.

Figure 10:
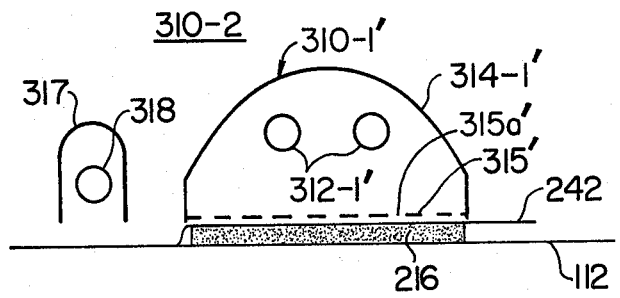
FIG. 10 is a view similar to FIG. 9 but illustrating a further modification of the pre-exposure device shown in FIGS. 1 and 2.

FIG. 10 illustrates a further modified pre-exposure device 310-2 which comprises a dotted image exposure means 310-1', an auxiliary actinic light source 318 and a reflector 317 disposed thereabove. The dotted image exposure means 310-1' is substantially similar to the first modification 310-1 shown in FIG. 9 which the exception that the number of the lamps forming the actinic light source of the pre-exposure device 310-1 in FIG. 9 is reduced. Similar parts are designated by similar reference numerals added with primes. The auxiliary actinic light source 318 is not covered with a dotted image-bearing sheet. A photopolymer plate produced by the apparatus according to the further modification shown in FIG. 10 presents a cross-sectional configuration as shown in FIG. 13. This cross-sectional configuration is substantially similar to that shown in FIG. 12 with the exception that, due to the exposure to the actinic radiation 318a from the auxiliary light source 318, a portion of the thickness of the photosensitive layer 216 adjacent to the upper surface thereof is hardened uniformly throughout the entire area of the layer to form substantially flat bottoms 216c' which interconnect large and small projections 216a and 216b produced by the actinic radiations 322a and 312-1'a. The photopolymer plate shown in FIG. 13 provides an advantage similar to that obtained from the photopolymer plate shown in FIG. 12.

Instead of the continuous web of the backing material 242 being drawn from the supply roll 240, preliminarily severed sheets of the backing material each having a required length may be successively fed to the liquid photosensitive material applying station. In this alternative case, the roll 240, the return roller 260 and the cutter 500 will be unnecessary.

Pinch roller units similar to the pinch roller units 600 described above may be provided along the edges of the transparency-conveying film material 330 to keep the film material in wrinkle-free condition.

What we claim is:

1. In an improved process of producing a photopolymer plate having relief image areas thereon, the process comprising the steps of:
   (a) feeding a sheet of protective film material to a liquid photosensitive material applying station, said film material being capable of transmitting actinic radiation therethrough;
   (b) applying a liquid photosensitive material to the upper surface of said sheet of protective film material to form a layer of the photosensitive material thereon;
   (c) laminating a sheet of a backing material onto said layer of photosensitive material to form an assembly of said protective film material, said layer of photosensitive material and said backing material;
   (d) conveying said assembly to a relief exposure station and exposing said assembly through an image-bearing transparency to the actinic radiation;
   (e) removing said sheet of protective film material from the lower surface of the thus exposed layer of photosensitive material; and
   (f) removing unhardened non-exposed portions of said layer of photosensitive material to form relief images on said backing material; the improvement comprising:
   performing said liquid photosensitive material applying step, said backing material laminating step, said exposing step and said protective film removing step in sequential manner and in a substantially horizontal elongated plane, wherein one end of the plane is positioned adjacent to said liquid photosensitive material applying station and the other end is positioned adjacent the point wherein said sheet of protective film material is removed from the lower surface of the exposed layer of photosensitive material,
   supplying successive portions of a continuous web of said protective film material into said horizontal plane so that a length of said protective film material extends in said horizontal plane substantially in wrinkle-free condition;
   supporting, at said liquid photosensitive material applying station, a part of said length of protective film material by a substantially flat upper surface of a stationary support member while said part of said length of protective film material is being coated with a layer of said liquid photosensitive material;
   generally downwardly turning the leading end of said length of protective film material at the other end of said horizontal plane and pulling said leading end in said turned direction so that successive portions of said continuous web of protective film material are travelled along said horizontal plane, whereby said layer of photosensitive material and said sheet of backing material thereon are conveyed by said continuous web of protective film material to said relief exposure station for the exposure of said layer through said image-bearing transparency and through said protective film material to said actinic radiation and said protective film material is removed at said other end of said horizontal plane from the lower surface of the thus exposed layer.

2. A process of producing a photopolymer plate as defined in claim 1, wherein said continuous web of protective film material is drawn from a supply roll and is guided into said horizontal elongated plane by a pair of parallel and spaced guide rollers disposed at the ends of said horizontal elongated plane.

3. A process of producing a photopolymer plate as defined in claim 2, wherein a continuous web of said backing material is drawn from a supply roll, the leading end portion of the web of backing material thus drawn is guided and laminated onto said layer of photosensitive material by a third roller while said layer is moved by said protective film material, and said web of backing material is severed along a line upstream of the trailing edge of said layer of photosensitive material to separate said leading end portion of said backing material after said layer reaches said relief exposure station.

4. A process of producing a photopolymer plate as defined in claim 3, wherein said backing material is capable of transmitting the actinic radiation and wherein the upper surface of said layer of photosensitive material is exposed through said backing material to a pre-exposure actinic radiation before said assembly reaches said relief exposure station.

5. A process of producing a photopolymer plate as defined in claim 4, wherein the upper surface of said layer of photosensitive material is exposed through said backing material and through a dotted image-bearing sheet to said pre-exposure actinic radiation before said assembly reaches said relief exposure station.

6. A process of producing a photopolymer plate as defined in claim 5, wherein the upper surface of said layer of photosensitive material is further exposed through said backing material to an auxiliary pre-exposure actinic radiation before said layer is exposed to said pre-exposure actinic radiation.

7. A process of producing a photopolymer plate as defined in claim 4, wherein said image-bearing transparency is fed to said exposure station by a continuous web of a transparency-conveying film material which is capable of transmitting the actinic radiation and runs through said relief exposure station in a second substantially horizontal plane slightly below the first-said horizontal plane.

8. A process of producing a photopolymer plate as defined in claim 7, wherein said protective film material and said transparency-conveying film material are travelled intermittently and wherein, during the exposure in said relief exposure station, said assembly, said image-bearing transparency and said transparency-conveying film material are held stationary and engaged by a pair of upper and lower rigid plates, the lower plate being capable of transmitting the actinic radiation.

9. A process of producing a photopolymer plate as defined in claim 3, wherein said image-bearing transparency is fed to said exposure station by a continuous web of a transparency-conveying film material which is capable of transmitting the actinic radiation and runs through said relief exposure station in a second substantially horizontal plane slightly below the first-said horizontal plane.

10. A process of producing a photopolymer plate as defined in claim 9, wherein said protective film material and said transparency-conveying film material are travelled intermittently and wherein, during the exposure in said relief exposure station, said assembly, said image-bearing transparency and said transparency-conveying film material are held stationary and engaged by a pair of upper and lower rigid plates, the lower plate being capable of transmitting the actinic radiation.

11. A process of producing a photopolymer plate as defined in claim 2, wherein a sheet of said backing material is supplied to said liquid photosensitive material applying station and guided and laminated onto said layer of photosensitive material by a third roller while said layer is moved by said protective film material.

12. A process of producing a photopolymer plate as defined in claim 11, wherein said image-bearing transparency is fed to said exposure station by a continuous web of a transparency-conveying film material which is capable of transmitting the actinic radiation and runs through said relief exposure station in a second substantially horizontal plane slightly below the first-said horizontal plane.

13. A process of producing a photopolymer plate as defined in claim 12, wherein said protective film material and said transparency-conveying film material are travelled intermittently and wherein, during the exposure in said relief exposure station, said assembly, said image-bearing transparency and said transparency-conveying film material are held stationary and engaged by a pair of upper and lower rigid plates, the lower plate being capable of transmitting the actinic radiation.

14. A process of producing a photopolymer plate as defined in claim 11, wherein said backing material is capable of transmitting the actinic radiation and wherein the upper surface of said layer of photosensitive material is exposed through said backing material to a pre-exposure actinic radiation before said assembly reaches said relief exposure station.

15. A process of producing a photopolymer plate as defined in claim 14, wherein the upper surface of said layer of photosensitive material is exposed through said backing material and through a dotted image-bearing sheet to said pre-exposure actinic radiation before said assembly reaches said relief exposure station.

16. A process of producing a photopolymer plate as defined in claim 15, wherein the upper surface of said layer of photosensitive material is further exposed through said backing material to an auxiliary pre-exposure actinic radiation before said layer is exposed to said pre-exposure actinic radiation.

17. A process of producing a photopolymer plate as defined in claim 14, wherein said image-bearing transparency is fed to said exposure station by a continuous web of a transparency-conveying film material which is capable of transmitting the actinic radiation and runs through said relief exposure station in a second substantially horizontal plane slightly below the first-said horizontal plane.

18. A process of producing a photopolymer plate as defined in claim 17, wherein said protective film material and said transparency-conveying film material are travelled intermittently and wherein, during the exposure in said relief exposure station, said assembly, said image-bearing transparency and said transparency-conveying film material are held stationary and engaged by a pair of upper and lower rigid plates, the lower plate being capable of transmitting the actinic radiation.

19. A process of producing a photopolymer plate as defined in claim 2, wherein said image-bearing transparency is fed to said exposure station by a continuous web of a transparency-conveying film material which is capable of transmitting the actinic radiation and runs through said relief exposure station in a second substantially horizontal plane slightly below the first-said horizontal plane.

20. A process of producing a photopolymer plate as defined in claim 19, wherein said protective film material and said transparency-conveying film material are travelled intermittently and wherein, during the exposure in said relief exposure station, said assembly, said image-bearing transparency and said transparency-conveying film material are held stationary and engaged by a pair of upper and lower rigid plates, the lower plate being capable of transmitting the actinic radiation.

21. In an improved apparatus for producing a photopolymer plate having relief image areas thereon, said apparatus comprising:
   (a) a liquid photosensitive material applying station;
   (b) means for feeding to said station a sheet of protective film material capable of transmitting actinic radiation therethrough;
   (c) means for applying a liquid photosensitive material to the upper surface of said sheet of protective film material to form a layer of photosensitive material thereon;
   (d) means for laminating a sheet of a backing material onto said layer of photosensitive material to form an assembly of said protective film sheet, said photosensitive material layer and said backing material sheet;
   (e) relief exposure means designed to receive said assembly and including a light source for directing the actinic radiation through an image-bearing transparency to said photosensitive material layer;
   (f) means for removing said sheet of protective film material from the lower surface of the thus exposed layer of photosensitive material; and
   (g) means for removing unhardened non-exposed portions of said layer of photosensitive material to form relief images on said sheet of backing material;
   (h) said liquid photosensitive material applying means, said laminating means, said exposure means and said protective film removing means being arranged in series; the improvement comprising:
   a pair of parallel and spaced guide rollers defining a substantially horizontal elongated plane generally along which said series of means are disposed, one of said pair of guide rollers being disposed adjacent to one end of said series of means adjacent to said liquid photosensitive material applying station, the other guide roller being disposed at the other end of said series of means;
   means for supplying successive portions of a continuous web of said protective film material into said horizontal plane so that a length of said protective film material extends between said pair of guide rollers substantially in wrinkle-free condition, said sheet of protective film material to which said liquid photosensitive material is applied being a part of said length of protective film material;
   a stationary member at said liquid photosensitive material applying station having a substantially flat upper surface disposed in face to face contacting and supporting relationship to said part of said length of protective film material while said part is being coated with said layer of photosensitive material; and
   means for generally downwardly pulling the leading end of said length of protective film material around the periphery of said other guide roller so that successive portions of said continuous web of protective film material are travelled from said one guide roller through said series of means to said other guide roller, whereby said photosensitive material layer and said backing material sheet thereon are conveyed by said continuous web of protective film material into said relief exposure means for the exposure of said layer and said protective film material is removed at said other guide roller from the lower surface of the thus exposed layer of photosensitive material.

22. An apparatus for producing a photopolymer plate as defined in claim 21, wherein said means for supplying successive portions of a continuous web of said protective film material include a supply roll disposed adjacent said one guide roller and said pulling means include a power-operated driving roller disposed below said other guide roller in frictional driving engagement with successive portions of said web of protective film material.

23. An apparatus for producing a photopolymer plate as defined in claim 22, wherein said laminating means includes a supply roll of a continuous web of said backing material and a second power-operated driving roller disposed slightly above the upper surface of said stationary member for drawing the continuous web of said backing material from said supply roll and guiding and laminating the leading end portion of said continuous web of backing material onto the upper surface of said layer of photosensitive material while said layer is moved by said protective film material, and wherein a cutter is provided to sever the web of said backing material along a line upstream of the trailing edge of said layer after said layer reaches said relief exposure means.

24. An apparatus for producing a photopolymer plate as defined in claim 23, further including means for moving successive portions of a continuous web of a transparency-conveying film material through said relief exposure means in a second substantially horizontal plane slightly below the first-said horizontal plane, said transparency-conveying film material being capable of transmitting the actinic radiation and designed to receive thereon an image-bearing transparency at a place remote from said relief exposure means and convey the thus received transparency thereto.

25. An apparatus for producing a photopolymer plate as defined in claim 24, wherein said protective film material and said transparency-conveying film material are moved intermittently and wherein said relief exposure means further include a pair of upper and lower rigid plates for holding stationary said assembly, said image-bearing transparency and said transparency-conveying film material during the relief exposure to said lower actinic light source, said lower rigid plate being capable of transmitting the actinic radiation, said upper rigid plate being movable toward and away from said lower rigid plate.

26. An apparatus for producing a photopolymer plate as defined in claim 23, wherein said cutter includes a cutting member, means for separating the web of said backing material upwardly away from the underlying protective film material into cutting engagement with said cutting member and means for moving said cutting member and said separating means across the width of said protective film material.

27. An apparatus for producing a photopolymer plate as defined in claim 26, wherein said cutting member comprises a cutting disc having cutting edge formed along the peripheral edge thereof and driven by a motor, said separating means comprising a generally wedge-shaped member disposed just below the bottom of said cutting edge, and wherein said cutter further include suction means for sucking up the edge portion of the web of protective film material adjacent to said wedge-shaped member away from the underlying protective film material to facilitate the insertion of said wedge-shaped member into a gap between said backing material and said protective film material.

28. An apparatus for producing a photopolymer plate as defined in claim 23, wherein said backing material is capable of transmitting the actinic radiation and wherein a pre-exposure device is disposed above said elongated horizontal plane between said stationary member and said cutter and includes an upper light source for directing a pre-exposure actinic radiation through said backing material to the upper surface of said layer of photosensitive material.

29. An apparatus for producing a photopolymer plate as defined in claim 28, further including means for moving successive portions of a continuous web of a transparency-conveying film material through said relief exposure means in a second substantially horizontal plane slightly below the first-said horizontal plane, said transparency-conveying film material being capable of transmitting the actinic radiation and designed to receive thereon an image-bearing transparency at a place remote from said relief exposure means and convey the thus received transparency thereto.

30. An apparatus for producing a photopolymer plate as defined in claim 29, wherein said protective film material and said transparency-conveying film material are moved intermittently and wherein said relief exposure means further include a pair of upper and lower rigid plates for holding stationary said assembly, said image-bearing transparency and said transparency-conveying film material during the relief exposure to said lower actinic light source, said lower rigid plate being capable of transmitting the actinic radiation, said upper rigid plate being movable toward and away from said lower rigid plate.

31. An apparatus for producing a photopolymer plate as defined in claim 28, wherein said pre-exposure device further includes a dotted image-bearing sheet disposed between said upper actinic light source and the first-said horizontal plane, the dots on said dotted image-bearing sheet being capable of transmitting more actinic radiation than the remainder of said dotted image-bearing sheet.

32. An apparatus for producing a photopolymer plate as defined in claim 31, wherein said pre-exposure device further includes an auxiliary pre-exposure actinic light source disposed above the first-said horizontal plane and upstream of the upper light source which is disposed above said dotted image-bearing sheet.

33. An apparatus for producing a photopolymer plate as defined in claim 22, further including means for moving successive portions of a continuous web of a transparency-conveying film material through said relief exposure means in a second substantially horizontal plane slightly below the first-said horizontal plane, said transparency-conveying film material being capable of transmitting the actinic radiation and designed to receive thereon an image-bearing transparency at a place remote from said relief exposure means and convey the thus received transparency thereto.

34. An apparatus for producing a photopolymer plate as defined in claim 33, wherein said protective film material and said transparency-conveying film material are moved intermittently and wherein said relief exposure means further include a pair of upper and lower rigid plates for holding stationary said assembly, said image-bearing transparency and said transparency-conveying film material during the relief exposure to said lower actinic light source, said lower rigid plate being capable of transmitting the actinic radiation, said upper rigid plate being movable toward and away from said lower rigid plate.

35. An apparatus for producing a photopolymer plate as defined in claim 22, further including means for applying tension to the length of said protective film material between said pair of guide rollers to keep said length of protective film material in substantially wrinkle-free condition, said tension applying means including means for applying tension in the longitudinal direction of said length of protective film material and means for applying tension in the widthwise direction of said length of protective film material.

36. An apparatus for producing a photopolymer plate as defined in claim 35, wherein said longitudinal tension applying means comprises a tension roller disposed between said supply roll of said protective film material and said one guide roller.

37. An apparatus for producing a photopolymer plate as defined in claim 35, wherein said widthwise tension applying means comprises a plurality of pairs of pinch roller units disposed along side edges of said length of protective film material so that the pinch roller units of each pair are substantially aligned in widthwise direction of said length of protective film material, each of the pinch roller units including a pair of upper and lower pinch rollers in rolling contact with the upper and lower surfaces of successive portions of said protective film material along one of the edges thereof, the axes of the pinch rollers of each unit being disposed in a substantially vertical plane which forms an angle with a second vertical plane perpendicular to the longitudinal axis of said length of protective film material, the arrangement being such that the portions of the pinch rollers of each unit nearer to the longitudinal axis of said protective film material are positioned downstream of the portions of said pinch rollers remote from said longitudinal axis of said protective material.

* * * * *